US009414520B2

(12) United States Patent
Campbell et al.

(10) Patent No.: US 9,414,520 B2
(45) Date of Patent: Aug. 9, 2016

(54) IMMERSION COOLED MOTOR CONTROLLER

(71) Applicant: Hamilton Sundstrand Corporation, Charlotte, NC (US)

(72) Inventors: Kris H. Campbell, Poplar Grove, IL (US); Christopher J. Courtney, Janesville, WI (US); Joshua Scott Parkin, Loves Park, IL (US); Charles Shepard, DeKalb, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 404 days.

(21) Appl. No.: 13/903,127

(22) Filed: May 28, 2013

(65) Prior Publication Data

US 2014/0355212 A1    Dec. 4, 2014

(51) Int. Cl.
*H05K 7/20*    (2006.01)
(52) U.S. Cl.
CPC ............ *H05K 7/20236* (2013.01); *H05K 7/203* (2013.01); *H05K 7/20936* (2013.01)
(58) Field of Classification Search
CPC ............ H05K 7/20236; H05K 7/2089; H05K 7/20927–7/20936; H01L 23/44; H02P 27/06
USPC .................. 361/699, 701; 165/80.4
See application file for complete search history.

(56) References Cited

U.S. PATENT DOCUMENTS

| 4,619,316 | A | * | 10/1986 | Nakayama et al. ...... 165/104.33 |
| D317,907 | S | * | 7/1991 | McCarthy ................. D13/179 |
| 5,305,316 | A | * | 4/1994 | Yoshida et al. ............... 370/357 |
| 5,818,705 | A | * | 10/1998 | Faulk ............................... 363/48 |
| 6,628,191 | B1 | * | 9/2003 | Wobben ........................ 336/234 |
| 7,957,145 | B2 | * | 6/2011 | Suzuki et al. ................. 361/701 |
| 2011/0315343 | A1 | * | 12/2011 | Campbell et al. ............ 165/80.3 |
| 2012/0080165 | A1 | | 4/2012 | Pal | |

FOREIGN PATENT DOCUMENTS

| DE | 3026881 A1 | 2/1982 |
| EP | 2291065 A2 | 3/2011 |
| GB | 2199203 A | 6/1988 |

OTHER PUBLICATIONS

Texas Instruments, Application Report, SNOA460—Feb. 2005, "AN-1364 TO-247 Package", 10 pages.
PCIM magazine reprint Jul. 1995, Robert West, "Power", "Common Mode Inductors for EMI Filters Require Careful Attention to Core Material Selection".
"Gate Drivers", retrieved from "http://en.wikipedia.org/w/index.php?title=Gate_Drivers&oldid=546366293", 2 pages, accessed Apr. 9, 2013.

(Continued)

*Primary Examiner* — Tuan T Dinh
*Assistant Examiner* — Mukund G Patel
(74) *Attorney, Agent, or Firm* — Locke Lord LLP; Scott D. Wofsy; Christopher J. Cillié

(57) ABSTRACT

An immersion cooled motor controller assembly is disclosed that includes a sealed housing, a fluorocarbon cooling liquid contained in the sealed housing, and an AC/AC motor controller disposed in the sealed housing and submerged in the fluorocarbon cooling liquid, wherein the AC/AC motor controller includes a power board module adapted and configured to operate at power levels greater than 30 kW.

10 Claims, 3 Drawing Sheets

(56) References Cited

OTHER PUBLICATIONS

Powerex, Jun. 1, 2009, Application Notes: "Introduction to Three Level Inverter (TLI) Technology", 3 pages.
Power Film Capacitor Application Guide, "DC Film Capacitors for Power Electronics an Overview", 3 pages; accessed prior to Aug. 1, 2013.
"Active Rectification:, retrieved from "http://en.wikipedia.org/w/index.php?title=Active_rectification&oldid=546448543, 2 pages, accessed Apr. 9, 2013.
"Variable-frequency drive", retrieved from "http://en.wikipedia.org/wiki/Variable-frequency_drive&oldid=548760830", 7 pages, accessed Apr. 9, 2013.
"Smart Heatsinks Unlike any others", Smart Heatsinks, "http://www.smartheatsinks.com/Universal.htm", 3 pages, accessed Apr. 15, 2013.
"Rectifier", retrieved from http://en.wikipedia.org/w/index.php?title=Rectifier&oldid=548514114, 17 pages, accessed Apr. 9, 2013.
"MOSFET", retrived from "http://en.wikipedia.org/w/index.php?title=MOSFET&oldid=550350991", 21 pages, accessed Apr. 15, 2013.
Search Report and Opinion issued by the European Patent Office on Mar. 16, 2015 for European Patent Application No. 14170405.

* cited by examiner

IMMERSION COOLED MOTOR CONTROLLER

BACKGROUND OF THE INVENTION

1. Field of the Invention

The subject invention relates generally to power electronic convertors, and more particularly, to a high power immersion cooled AC/AC motor controller for use in aerospace applications.

2. Description of Related Art

Throughout the aerospace industry, the electrical power requirements of modern aircraft are steadily increasing. These increased power requirements coupled with the harsh operating environment create a demand for higher power density and improved thermal management from the power electronic converters that are typically used in aerospace applications such as for example, motor controllers and battery charging systems.

Power electronic converters require the rapid switching of large currents by power electronic semiconductor devices such as power MOSFETs. Typically, in power convertor circuits, reactive current is provided by a bank of bulk film capacitors. Bulk film capacitors and power MOSFETs are important aspects in any aerospace power electronic converter.

Often the bulk capacitors are sized by their current rating and thus become thermally limited due to excessive heating and internal hot spots. MOSFETs generate a significant amount of heat too and typically need to be mounted to a heat sink.

Unless, properly designed and controlled, high rates of heat generation can result in high operating temperatures for electronic equipment. This will jeopardize its safety and reliability. Therefore, thermal control has become increasingly important in the design and operation of power conversion equipment, particularly in aerospace applications.

Several cooling techniques are employed in electronic equipment. These include conduction cooling, natural convection and radiation cooling, forced-air cooling, liquid cooling and immersion cooling. The immersion cooling technique is the most reliable, since it does not involve any penetration into the electronic enclosure and the component resides in a completely sealed liquid environment.

It would be beneficial to incorporate immersion cooling in a power electronic convertor so that it can support the high power density requirements of a more electric aircraft without unduly increasing the size and weight of the convertor.

SUMMARY OF THE INVENTION

The subject invention is directed to a motor controller assembly for use in aerospace applications which includes a sealed housing, a non-conductive, fluorocarbon cooling liquid contained in the housing, and an AC/AC motor controller disposed in the housing and submerged in the cooling liquid.

The motor controller includes, among other things, a power board module adapted and configured to operate at power levels greater than 30 kW. The power board module has a plurality of closely packed, vertically mounted power semiconductor switches or MOSFETs. Each switch has an individual heat sink operatively associated therewith to increase the surface area that is available for cooling in the liquid.

There are finned heat sinks provided on interior and exterior surfaces of the sealed housing to help conduct heat absorbed by the cooling liquid out of the housing. In addition, a low density filler material is disposed within the sealed housing to reduce the volume of cooling liquid contained therein, and thereby reduce the overall weight of the assembly.

Preferably, the power board further includes a bank of DC link bulk film capacitors to produce reactive current and gate drive circuitry to control an active rectifier. The motor controller further includes a filter board module to suppress harmonic distortion in the input current to the rectifier and a control board module having a digital signal processor. The motor controller further includes a bank of differential mode inductors and a bank of common mode inductors for blocking high frequency differential mode and common mode currents respectively.

These and other features of the immersion cooled AC/AC motor controller of the subject invention and the manner in which it is employed will become more readily apparent to those having ordinary skill in the art from the following enabling description of the preferred embodiments of the subject invention taken in conjunction with the several drawings described below.

BRIEF DESCRIPTION OF THE DRAWINGS

So that those skilled in the art to which the subject invention appertains will readily understand how to make and use the immersion cooled motor controller of the subject invention without undue experimentation, preferred embodiments thereof will be described in detail herein below with reference to certain figures, wherein.

DETAILED DESCRIPTION OF PREFERRED EMBODIMENTS

Figure 1:
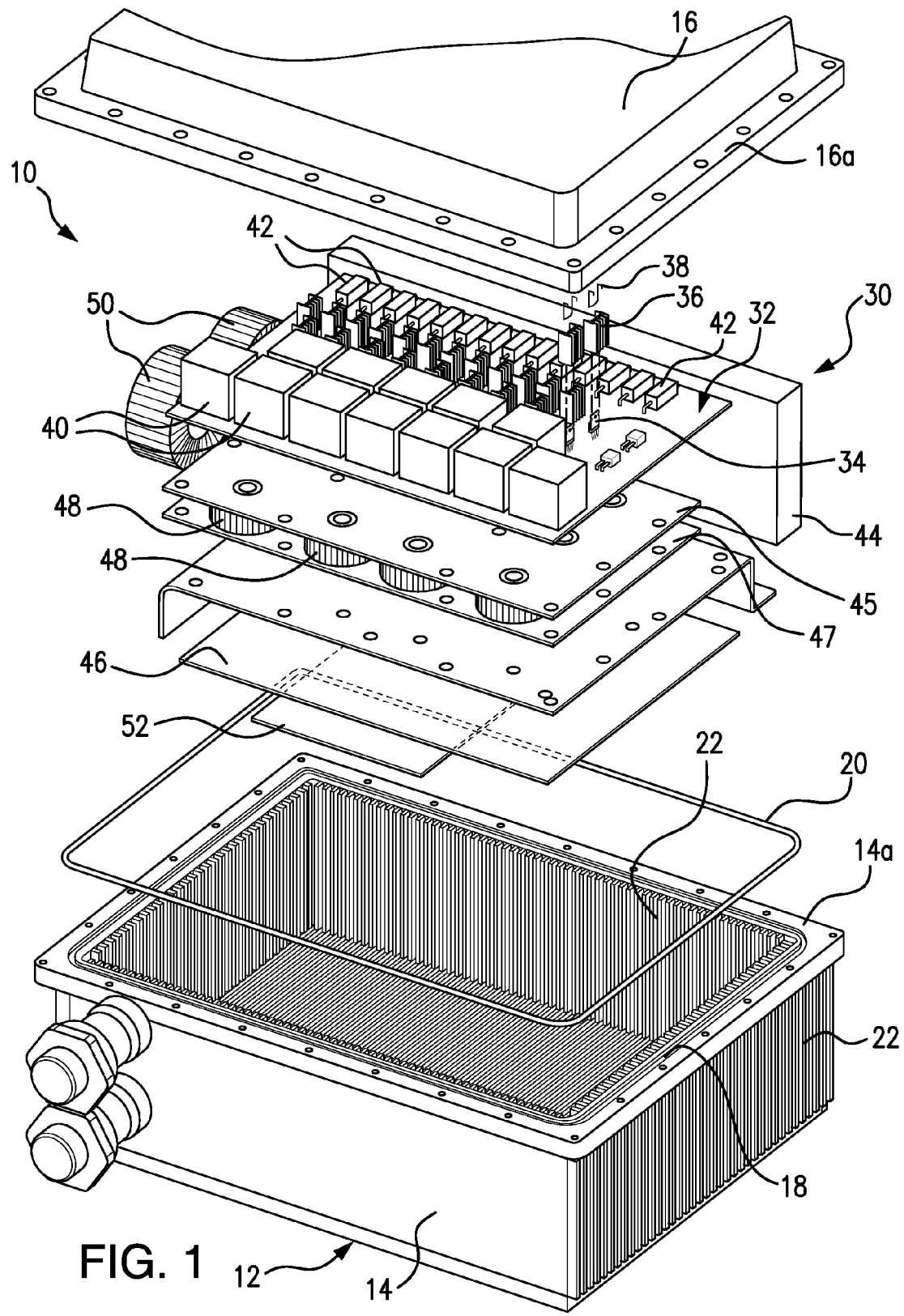
FIG. 1 is a perspective view of an immersion cooled motor controller assembly constructed in accordance with the subject invention, with parts separated for ease of illustration.
Figure 2:
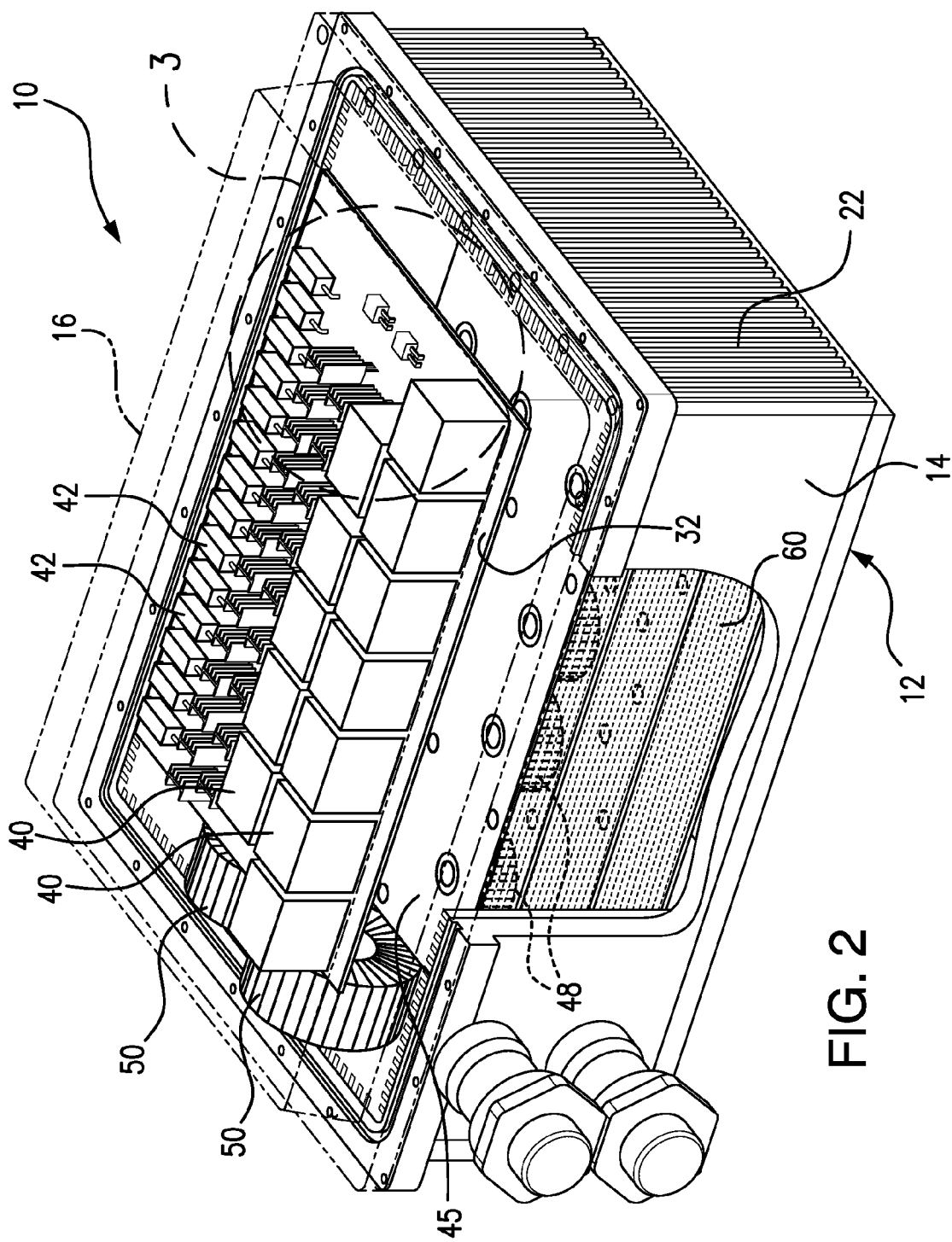
FIG. 2 is a perspective view of the immersion cooled motor controller assembly of FIG. 1 is an assembled condition, with a wall of the housing cut away to illustrate the cooling fluid contained within the housing.

Referring now to the drawings, wherein like reference numerals identify similar structural features or aspects of the subject invention, there is illustrated in FIGS. 1 and 2 a power electronic convertor, and more particularly, to an AC/AC motor controller assembly constructed in accordance with a preferred embodiment of the subject invention and designated generally by reference numeral 10. Motor controller assembly 10 is a high power (>30 kW) immersion cooled AC/AC motor controller assembly that is particularly adapted and configured for use in aerospace applications with high power density requirements.

The motor controller assembly 10 includes a sealed housing 12 consisting of a generally rectangular enclosure 14 and a complementary cover 16. The enclosure 14 has an upper mounting flange 14a and the cover 16 has a corresponding mounting flange 16a. A channel 18 is formed about the inner periphery of the mounting flange 14a of enclosure 14 for accommodating an elastomeric sealing gasket 20. The sealing gasket 20 ensures a fluid tight seal between flanges 14a and 16a. The housing 12 may otherwise be hermetically sealed. Certain interior and exterior walls of enclosure 14 include finned heat sinks 22. The heat sinks serve to efficiently conduct heat from the housing 14, as described in more detail below.

An AC/AC motor controller 30 is disposed within the sealed housing 12 of motor controller assembly 10. The motor controller 30 includes, among other components, a power board module 32. Power board module 32 is a printed wiring board (PWB) that includes a bank of power semiconductor switches 34. More particularly, the power board module 32 includes an active rectifier (e.g., a Vienna-type active rectifier) that includes, among other things, a plurality of closely packed, vertically mounted (standing upright) SiC MOSFETs 34 or similar power semiconductor switches. These switches dissipate a significant amount of heat during operation. Because of the high density of these switching components in a relatively small area of the power board module 32, each MOSFET 34 has an individual heat sink 36 associated therewith to increase the surface area that is available for cooling within the enclosure 12. The heat sinks 36 are preferably clip-on type heat sinks, which include an integral spring clip 38 or similar mechanism to releasably engage the MOSFET 34. Consequently, there is no need to connect the MOSFETs 34 to a liquid cooled or forced air heat sink.

The power board 32 of motor controller 30 further includes a bank of DC link capacitors 40 providing reactive current. These components are typically configured as bulk film capacitors and tend to generate a significant amount of heat during operation.

The power board 32 further includes gate drive circuitry 42 for driving the gates or analog switches that deliver current from a source to the MOSFETs and diodes of the active rectifier. The gate drive circuitry 42 is typically associated with a pulse width modulator (PWM) that generates control signals for the active rectifier.

The motor controller 30 further includes a filter board module 44. The filter board module 44 is adapted and configured to suppress or otherwise minimize high order harmonic distortion in the input current to the active rectifier. For example, the filter board may be designed to minimize the harmonic distortion of the line current.

Motor controller 30 further includes a control board module 46 which is a PWB that includes a digital signal processor (DSP). The DSP includes a microprocessor and associated components for processing digital signals.

Motor controller 30 also includes a bank of differential mode inductors 48 and a bank of common mode inductors 50. The inductors 48, 50 are typically constructed by winding a wire coil around a ferromagnetic core. They are used to block high frequency alternating current while passing signals of much lower frequency and direct current by having an impedance that is largely determined by reactance, which is proportional to frequency.

Those skilled in the art will readily appreciate that differential mode inductors 48 will provide filtering for differential currents and common mode inductors 50 will provide filtering for common-mode currents.

The common mode and differential mode inductors 48, 50 are isolated from the electronic components of the motor controller 30 by EMI shield plates. For example, upper and lower EMI shields 45, 47 isolate the differential mode inductors 48 from the control board module 46 and other electronic components of the motor controller 30.

Motor controller 30 further includes a power supply board module 52. The power supply board 52 supplies voltage to the control board module 46. For example, the power supply board 52 may supply 28V and 15V of power to the control board module 46 to drive the digital signal processor.

As best seen in FIG. 2, a cooling liquid 60 is contained within the housing 12 of motor controller assembly 10. The modular motor controller 30 is immersed or otherwise submerged in the cooling liquid 60 to facilitate highly efficient nucleated cooling of the electronic component thereof. More particularly, the cooling liquid 60 facilitates nucleated cooling in conjunction with the power MOSFETs 34, the DC link capacitors 40, as well as the common mode and differential mode inductors 48, 50.

The heat absorbed by the cooling liquid 60 through nucleated boiling is transferred from the exterior walls of the housing 12 by the finned heat sinks 22. The heat transferred to the finned heat sinks 22 is then removed using conventional forced air cooling techniques.

The cooling liquid 60 is a non-conductive liquid, such as for example, a fluorocarbon fluid. A preferred dielectric cooling fluid is 3M's Fluorinert™ FC-72, which is thermally and chemically stable, compatible with sensitive materials and non-flammable. Key properties of Fluorinert™ FC-72 include: a typical boiling point of 56° C.; a dielectric strength of 38 KV (0.01 inch gap); and a dielectric constant (1 KHz) of 1.76.

The use of immersion cooling provides a significant increase in cooling capability relative to natural convention air cooling (15,000 W/m$^2$K versus 5 W/m$^2$K in natural convection air). This allows for a departure from the typical design of high power motor controllers. In particular, the immersion cooling enables power stage carrying currents that are in excess of 55 A integrated onto a single printed wiring board (PWB), which also includes DC link capacitance and the gate drive circuitry. Those skilled in the art will readily appreciate that because the entire motor controller 30 is sealed and submerged in an inert fluid, the risk of fire is essentially eliminated.

As described above, the power board module 32 is constructed using discrete power MOSFETs and diodes without the need for them to be mounted to a heat-sink. This allows for an increased density of components on the power board module 32. Indeed, with immersion cooling, power dissipation for the MOSFETs 34 can be increased to 190-210 W per switch with a small clip-on heat sink 36 to increase cooling surface area. By way of comparison, testing has shown that in free air, the power dissipation per MOSFET switch 34 would be approximately 10-20 W.

Without immersion cooling, the close packaging of these switches 34 would not be achievable. Overall, by employing immersion cooling, the power density of the motor controller 30 is increased to 1 kW/lb and the volumetric power density is increased to 77 kW/ft$^3$.

In addition, within the motor controller 30, because of the use of immersion cooling, there is greater than a 50% weight savings for the differential and common mode inductors 48, 50 due to the ability to use decreased wire gauge and operate at higher flux densities. That is, the wire size and equivalently the trace width of the external layers of the printed wiring board 32 can be reduced because of immersion cooling.

For example, testing has shown the ability to move from 6 AWG wire to 14 AWG wire for the windings of the inductors 48, 50, while still maintaining an acceptable operating temperature. Those skilled in the art will readily appreciate that in accordance with the American Wire Gauge Standards, increasing gauge numbers (i.e., from 6 to 14) give decreasing wire diameters, and thus a decrease in overall wire weight. The ability to decrease wire size and operate the ferromagnetic core at a higher loss gives the ability to significantly decrease the size of the common mode and differential mode inductors 48, 50.

Figure 3:
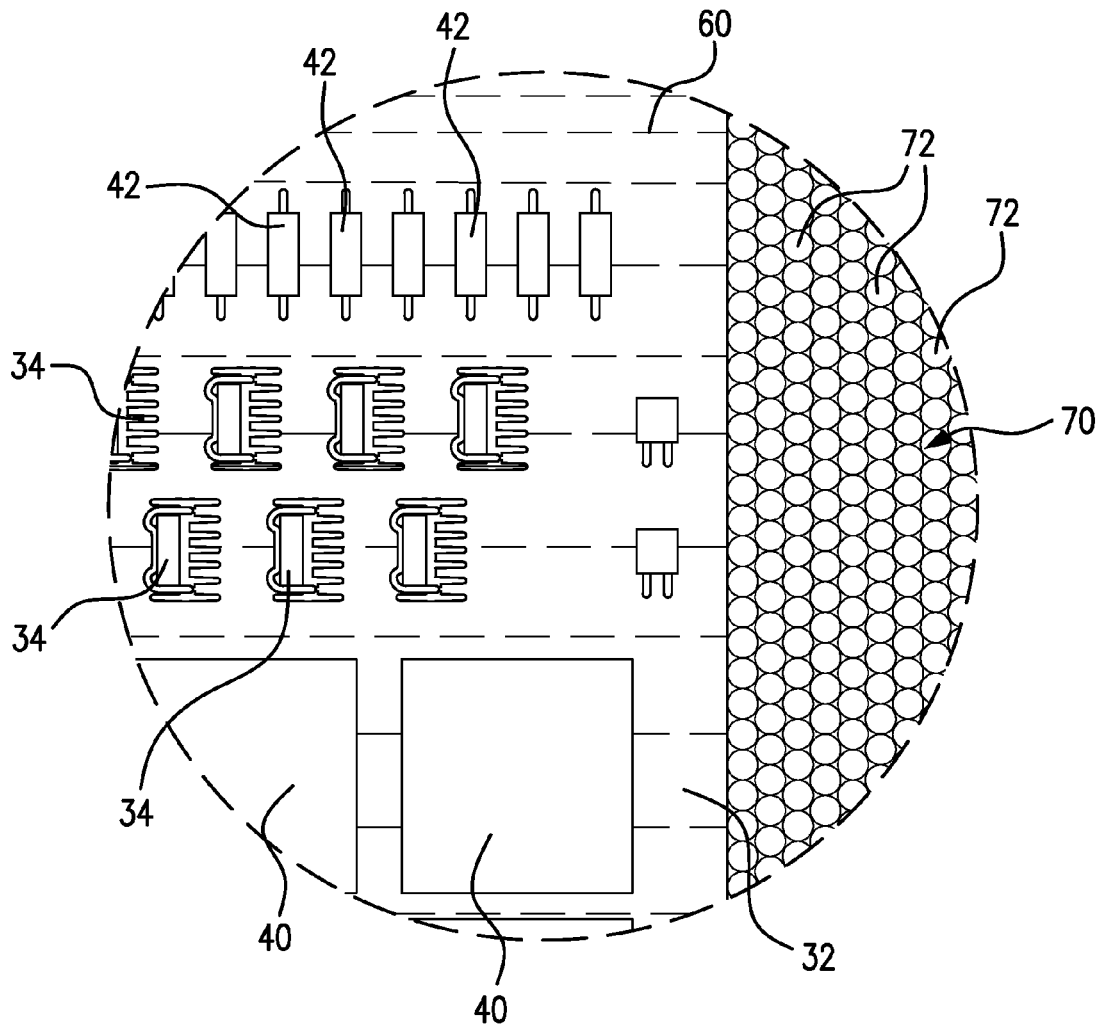
FIG. 3 is a localized view of the interior immersion cooled motor controller assembly, illustrating the use of a low density filler material to reduce the volume of cooling liquid contained therein.

In accordance with the subject invention, areas of the power converter assembly 10 in which high loss components are not present are filled with a light weight material to reduce the overall weight of the controller. For example, as illustrated in FIG. 3, a low density filler material 70 is disposed within the sealed housing to reduce the volume of cooling liquid contained therein. In this case, the filler material is a plurality of plastic beads 72. Other materials can also be employed, including, for example, a foam material or the like.

While the immersion cooled motor controller of the subject invention has been shown and described with reference to preferred embodiments, those skilled in the art will readily appreciate that various changes and/or modifications may be made thereto without departing from the spirit and scope of the subject invention as defined by the appended claims.

What is claimed is:

1. An immersion cooled motor controller assembly comprising:
   a) a sealed housing with finned heat sinks are provided on exterior surfaces of the housing;
   b) a non-conductive cooling liquid including a fluorocarbon contained in the housing; and
   c) a motor controller disposed in the housing and submerged in the non-conductive cooling liquid, the motor controller including:
   a power board module configured to operate at power levels that are greater than 30 kW, the power board module including:
      a printed wire board;
      a bank of closely packed, power semiconductor switches coupled to the printed wire board;
      a bank of DC link capacitors mounted to the printed wire board; and
      active rectifier gate drive circuitry mounted to the printed wire board and operatively connected to the power semiconductor switches;
   a bank of differential mode inductors adjacent to the printed wire board; and
   a bank of common mode inductors adjacent to the printed wire board,
   wherein the differential mode inductors and common mode inductors are constructed from 14 AWG wire.

2. An immersion cooled motor controller assembly as recited in claim 1, wherein a low density filler material is disposed within the housing to reduce the volume of cooling liquid contained therein.

3. An immersion cooled motor controller assembly as recited in claim 1, wherein each of the power semiconductor switches includes an individual clip-on heat sink to increase the surface area available for cooling.

4. An immersion cooled motor controller assembly as recited in claim 1, wherein the motor controller further includes a filter board module and a control board module.

5. An immersion cooled motor controller assembly comprising:
   a) a sealed housing with interior and exterior finned heat sinks,
      wherein the interior finned heat sinks are provided on lower, upper, and lateral surfaces of interior surfaces of the sealed housing;
   b) a fluorocarbon cooling liquid contained in the sealed housing; and
   c) a motor controller disposed in the sealed housing and submerged in the fluorocarbon cooling liquid to facilitate nucleated cooling of electronic components of the motor controller, the motor controller including a power board module, having:
      a printed wire board;
      a plurality of closely packed, vertically mounted power semiconductor switches coupled to the printed wire board;
      a bank of DC link capacitors mounted to the printed wire board; and
      active rectifier gate drive circuitry mounted to the printed wire board and operatively connected to the power semiconductor switches;
   a bank of differential mode inductors adjacent to the printed wire board; and
   a bank of common mode inductors adjacent to the printed wire board,
   wherein the differential mode inductors and common mode inductors are constructed from 14 AWG wire;
   wherein the motor controller has a power density of about 1 kW/lb and/or a volumetric power density of 77 kW/ft$^3$.

6. An immersion cooled motor controller assembly as recited in claim 5, wherein each semiconductor switch has an individual heat sink operatively associated therewith to increase the surface area available for cooling.

7. An immersion cooled motor controller assembly as recited in claim 5, wherein a low density plastic filler material is disposed within the sealed housing to reduce the volume of cooling liquid contained therein.

8. An immersion cooled motor controller assembly as recited in claim 5, wherein the motor controller further includes a filter board module and a control board module.

9. An immersion cooled motor controller assembly as recited in claim 5, wherein the power board module is adapted and configured to operate at power levels greater than 30 kW.

10. An immersion motor controller assembly as recited in claim 5, further including upper and lower EMI shield plates disposed within the sealed interior and isolating the common mode inductors and differential mode inductors from the power control module.

* * * * *